(12) United States Patent
Park et al.

(10) Patent No.: US 12,274,112 B2
(45) Date of Patent: Apr. 8, 2025

(54) ELECTROLUMINESCENT DISPLAY DEVICE

(71) Applicant: LG Display Co., Ltd., Seoul (KR)

(72) Inventors: TaeHan Park, Paju-si (KR); JongSung Kim, Paju-si (KR); Howon Choi, Paju-si (KR); Dongyoung Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 93 days.

(21) Appl. No.: 18/295,627

(22) Filed: Apr. 4, 2023

(65) Prior Publication Data

US 2023/0255046 A1 Aug. 10, 2023

Related U.S. Application Data

(63) Continuation of application No. 17/079,187, filed on Oct. 23, 2020, now Pat. No. 11,653,515.

(30) Foreign Application Priority Data

Oct. 25, 2019 (KR) .......................... 10-2019-0133406

(51) Int. Cl.
*H10K 50/125* (2023.01)
*H10K 50/11* (2023.01)
(Continued)

(52) U.S. Cl.
CPC .......... *H10K 50/125* (2023.02); *H10K 50/11* (2023.02); *H10K 50/15* (2023.02); *H10K 50/19* (2023.02);
(Continued)

(58) Field of Classification Search
CPC ... H10K 50/11–135; H10K 50/14–167; H10K 50/19; H10K 50/85–858;
(Continued)

(56) References Cited

U.S. PATENT DOCUMENTS 10,411,079 B2 9/2019 Cho et al.
10,872,940 B2 12/2020 Xu
(Continued)

FOREIGN PATENT DOCUMENTS

CN 107293572 A 10/2017
CN 108598123 A 9/2018
(Continued)

*Primary Examiner* — Shaun M Campbell
*Assistant Examiner* — Aneta B Cieslewicz
(74) *Attorney, Agent, or Firm* — SEED IP LAW GROUP LLP

(57) ABSTRACT

An electroluminescent display device is disclosed. The electroluminescent display device includes a substrate having thereon a first sub pixel and a second sub pixel, a first electrode in each of the first sub pixel and the second sub pixel on the substrate, an organic layer with P-type polarity or N-type polarity on the first electrode, and a second electrode on the organic layer. The organic layer provided in the first sub pixel and the organic layer provided in the second sub pixel are spaced apart from each other with a doping layer provided in the boundary area between the first sub pixel and the second sub pixel. The doping layer is doped with dopant whose polarity is opposite to that of the organic layer.

20 Claims, 10 Drawing Sheets

(51) Int. Cl.
| | |
|---|---|
| *H10K 50/14* | (2023.01) |
| *H10K 50/15* | (2023.01) |
| *H10K 50/155* | (2023.01) |
| *H10K 50/19* | (2023.01) |
| *H10K 50/858* | (2023.01) |
| *H10K 59/12* | (2023.01) |
| *H10K 59/122* | (2023.01) |
| *H10K 59/32* | (2023.01) |
| *H10K 59/35* | (2023.01) |
| *H10K 59/38* | (2023.01) |

(52) U.S. Cl.
CPC ......... *H10K 50/858* (2023.02); *H10K 59/122* (2023.02); *H10K 59/32* (2023.02); *H10K 59/35* (2023.02); *H10K 59/353* (2023.02); *H10K 50/14* (2023.02); *H10K 50/155* (2023.02); *H10K 59/12* (2023.02); *H10K 59/38* (2023.02)

(58) Field of Classification Search
CPC ....... H10K 50/879; H10K 59/12–1315; H10K 59/90–38; H10K 2102/351; H01L 225/558; H01L 27/3246; H01L 27/3244; H01L 27/3209; H01L 27/3211; H01L 27/3218; H01L 27/322; H01L 51/5056; H01L 51/506; H01L 51/5048; H01L 51/5278; H01L 51/5275; H01L 2251/558

See application file for complete search history.

(56) References Cited

U.S. PATENT DOCUMENTS

| | | |
|---|---|---|
| 2015/0060773 A1 | 3/2015 | Liang et al. |
| 2015/0311462 A1 | 10/2015 | Song et al. |
| 2016/0155785 A1 | 6/2016 | Sato |
| 2016/0155978 A1* | 6/2016 | Park ...................... H10K 50/17 438/46 |
| 2016/0190521 A1* | 6/2016 | Lee ........................ H10K 50/19 257/40 |
| 2018/0095195 A1 | 4/2018 | Kim et al. |

FOREIGN PATENT DOCUMENTS

| | | |
|---|---|---|
| CN | 109301078 A | 2/2019 |
| KR | 20160037778 A | 4/2016 |
| KR | 20160072010 A | 6/2016 |
| KR | 20170001099 A | 1/2017 |
| KR | 20190057749 A | 5/2019 |

* cited by examiner

ELECTROLUMINESCENT DISPLAY DEVICE

CROSS-REFERENCE TO RELATED APPLICATIONS

This application claims the benefit of the Korean Patent Application No. 10-2019-0133406 filed on Oct. 25, 2019, which are hereby incorporated by reference as if fully set forth herein.

BACKGROUND

Technical Field

The present disclosure relates to an electroluminescent display device.

Description of the Related Art

An electroluminescent display device is provided in such a way that an emission layer is provided between an anode electrode and a cathode electrode, and the emission layer emits light by an electric field generated between the above two electrodes, to thereby display an image.

The emission layer may be formed of an organic material which emits light when an exciton is produced by a bond of electron and hole, and the exciton falls to a ground state from an excited state, or may be formed of an inorganic material such as quantum dot.

The emission layer may be configured to emit different colored light by each sub pixel, for example, red colored light, green colored light and blue colored light, or may be configured to emit the same colored light by each sub pixel, for example, white colored light.

BRIEF SUMMARY

The inventors of the present disclosure have realized that among many other problems in the related art, a leakage current may be generated due to a transfer of electric charges between the neighboring sub pixels, whereby it may cause a deterioration of picture quality. Having appreciating the problems in the related art, one or more embodiments of the present disclosure provides an electroluminescent display device capable of reducing a deterioration of picture quality caused by a leakage current between neighboring sub pixels.

In accordance with an aspect of the present disclosure, the above and other technical benefits can be accomplished by the provision of an electroluminescent display device. The electroluminescent display device includes a substrate having a first sub pixel and a second sub pixel, a first electrode in each of the first sub pixel and the second sub pixel on the substrate, a first emission layer on the first electrode, a charge generation layer on the first emission layer, a second emission layer on the charge generation layer, and a second electrode on the second emission layer, wherein the charge generation layer includes an N-type charge generation layer on the first emission layer, and a P-type charge generation layer on the N-type charge generation layer, and the N-type charge generation layer provided in the first sub pixel and the N-type charge generation layer provided in the second sub pixel are spaced apart from each other with a P-type doping layer provided in the boundary area between the first sub pixel and the second sub pixel.

In accordance with another aspect of the present disclosure, there is provided an electroluminescent display device including a substrate having a first sub pixel and a second sub pixel, a first electrode in each of the first sub pixel and the second sub pixel on the substrate, an emission layer having a hole transport layer on the first electrode, and a second electrode on the emission layer, wherein the hole transport layer provided in the first sub pixel and the hole transport layer provided in the second sub pixel are spaced apart from each other with an N-type doping layer provided in the boundary area between the first sub pixel and the second sub pixel.

In accordance with a further aspect of the present disclosure, there is provided an electroluminescent display device including a substrate having a first sub pixel and a second sub pixel, a first electrode in each of the first sub pixel and the second sub pixel on the substrate, an organic layer with P-type polarity or N-type polarity on the first electrode, and a second electrode on the organic layer, wherein the organic layer provided in the first sub pixel and the organic layer provided in the second sub pixel are spaced apart from each other with a doping layer provided in the boundary area between the first sub pixel and the second sub pixel, and the doping layer is doped with dopant whose polarity is opposite to that of the organic layer.

BRIEF DESCRIPTION OF THE SEVERAL VIEWS OF THE DRAWINGS

The above and other objects, features and other advantages of the present disclosure will be more clearly understood from the following detailed description taken in conjunction with the accompanying drawings. In the drawings.

DETAILED DESCRIPTION

Figure 1:
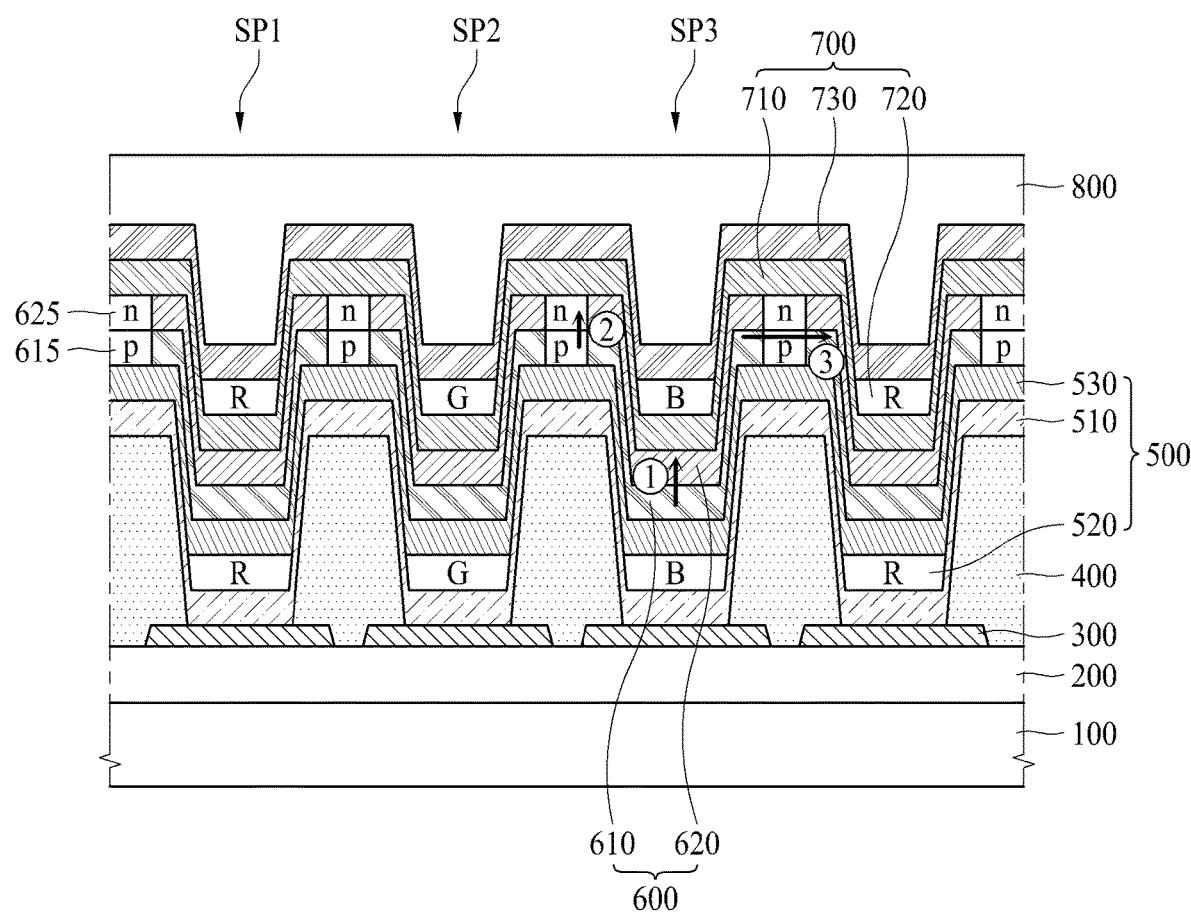
FIG. 1 is a schematic cross sectional view illustrating an electroluminescent display device according to one embodiment of the present disclosure.

Advantages and features of the present disclosure, and implementation methods thereof will be clarified through the following embodiments, described with reference to the accompanying drawings. The present disclosure may, however, be embodied in different forms and should not be construed as being limited to the embodiments set forth herein. Rather, these embodiments are provided so that this disclosure will be thorough and complete, and will fully convey the scope of the present disclosure to those skilled in the art.

The shapes, sizes, ratios, angles, and numbers disclosed in the drawings for describing embodiments of the present disclosure are merely examples, and thus the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the case in which "comprise," "have," and "include" described in the present specification are used, another part may also be present unless "only" is used. The terms in a singular form may include plural forms unless noted to the contrary.

In construing an element, the element is construed as including an error region although there is no explicit description thereof.

In describing a positional relationship, for example, when the positional order is described as "on," "above," "below," "beneath", and "next," the case of no contact therebetween may be included, unless "just" or "direct" is used. If it is mentioned that a first element is positioned "on" a second element, it does not mean that the first element is essentially positioned above the second element in the figure. The upper part and the lower part of an object concerned may be changed depending on the orientation of the object. Consequently, the case in which a first element is positioned "on" a second element includes the case in which the first element is positioned "below" the second element as well as the case in which the first element is positioned "above" the second element in the figure or in an actual configuration.

In describing a temporal relationship, for example, when the temporal order is described as "after," "subsequent," "next," and "before," a case which is not continuous may be included, unless "just" or "direct" is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in a co-dependent relationship.

In the drawings, the same or similar elements are denoted by the same reference numerals even though they are depicted in different drawings.

In the embodiments of the present disclosure, a source electrode and a drain electrode are distinguished from each other, for convenience of explanation. However, the source electrode and the drain electrode are used interchangeably. Thus, the source electrode may be the drain electrode, and the drain electrode may be the source electrode. Also, the source electrode in any one embodiment of the present disclosure may be the drain electrode in another embodiment of the present disclosure, and the drain electrode in any one embodiment of the present disclosure may be the source electrode in another embodiment of the present disclosure.

In one or more embodiments of the present disclosure, for convenience of explanation, a source region is distinguished from a source electrode, and a drain region is distinguished from a drain electrode. However, embodiments of the present disclosure are not limited to this structure. For example, a source region may be a source electrode, and a drain region may be a drain electrode. Also, a source region may be a drain electrode, and a drain region may be a source electrode.

Hereinafter, an electroluminescent display device according to the present disclosure will be described with reference to the accompanying drawings.

FIG. 1 is a schematic cross sectional view illustrating an electroluminescent display device according to one embodiment of the present disclosure.

As shown in FIG. 1, the electroluminescent display device according to one embodiment of the present disclosure includes a substrate 100, a circuit device layer 200, a first electrode 300, a bank 400, a first emission layer 500, a charge generation layer 600, a second emission layer 700, and a second electrode 800.

The substrate 100 may be formed of glass or plastic, but not limited to these materials. The substrate 100 may be formed of a semiconductor material such as silicon wafer. The substrate 100 may be formed of a transparent material or an opaque material. On the substrate 100, there are a first sub pixel (SP1), a second sub pixel (SP2), and a third sub pixel (SP3). For example, the first sub pixel (SP1) may emit red (R) colored light, the second sub pixel (SP2) may emit green (G) colored light, and the third sub pixel (SP3) may emit blue (B) colored light, but not limited to this structure.

The electroluminescent display device according to one embodiment of the present disclosure may be formed in a top emission type where emitted light advances upwardly. If the electroluminescent display device is formed in the top emission type, the substrate 100 may be formed of an opaque material as well as a transparent material.

The circuit device layer 200 is provided on the substrate 100.

In the circuit device layer 200, a circuit device comprising various signal lines, thin film transistors, and a capacitor is provided by each sub pixel (SP1, SP2, SP3). The signal lines may include a gate line, a data line, a power line, and a reference line, and the thin film transistors may include a switching thin film transistor, a driving thin film transistor, and a sensing thin film transistor.

The switching thin film transistor is switched by a gate signal supplied to the gate line, and the switching thin film transistor supplies a data voltage, which is supplied from the data line, to the driving thin film transistor.

The driving thin film transistor is switched by the data voltage supplied from the switching thin film transistor, and the driving thin film transistor generates a data current based on a power source supplied from the power line, and supplies the data current to the first electrode 300.

The sensing thin film transistor senses a deviation of a threshold voltage in the driving thin film transistor, which causes a deterioration of picture quality. The sensing thin film transistor supplies a current of the driving thin film transistor to the reference line in response to a sensing control signal supplied from the gate line or an additional sensing line.

The capacitor maintains the data voltage supplied to the driving thin film transistor for one frame period, and the capacitor is connected with each of gate and source terminals of the driving thin film transistor.

The first electrode 300 is provided on the circuit device layer 200, and is patterned by each sub pixel (SP1, SP2, SP3). That is, one of the first electrode 300 is formed in the first sub pixel (SP1), another first electrode 300 is formed in the second sub pixel (SP2), and another first electrode 300 is formed in the third sub pixel (SP3). The first electrode 300 may function as an anode of the electroluminescent display device.

The first electrode 300 is connected with the driving thin film transistor provided in the circuit device layer 200. In detail, the first electrode 300 may be connected with the source terminal or a drain terminal of the driving thin film transistor. To this end, a contact hole for exposing the source terminal or the drain terminal of the driving thin film transistor is provided in the circuit device layer 200, and the first electrode 300 is connected with the source terminal or the drain terminal of the driving thin film transistor via the contact hole.

If the electroluminescent display device according to one embodiment of the present disclosure is formed in the top emission type, the first electrode 300 may upwardly reflect the light emitted from the first emission layer 500 and the second emission layer 700. In this case, the first electrode 300 may be formed in a double-layered structure comprising a reflective layer for reflecting the light, and a conductive layer configured to supply a hole to the first emission layer 500. The reflective layer and the conductive layer may be in contact with each other, or may be spaced apart from each other with an insulating therebetween.

The bank 400 is configured to at least partially cover both ends of the first electrode 300 on the circuit device layer 200. Accordingly, it is possible to prevent a current from being concentrated into the ends of the first electrode 300, to thereby prevent a deterioration of emission efficiency. The bank 400 is formed as a matrix configuration on the boundary area between each of the plurality of sub pixels (SP1, SP2, SP3), and is configured to define an emission area. That is, some area of an upper surface of the first electrode 300, which is exposed without being covered by the bank 400, becomes the emission area.

The first emission layer 500 is provided in the sub pixel (SP1, SP2, SP3) area on the first electrode 300. Also, at least some layers of the first emission layer 500 may be provided on the boundary area between each sub pixel (SP1, SP2, SP3). That is, at least some layers of the first emission layer 500 may be provided in the area overlapped with the bank 400.

The first emission layer 500 may include a first hole transport layer 510, a first organic emission layer 520, and a first electron transport layer 530. Although not shown, the first emission layer 500 may further include an additional hole injection layer provided below the first hole transport layer 510.

The first hole transport layer 510 may be provided in each sub pixel (SP1, SP2, SP3) area and the boundary area between each sub pixel (SP1, SP2, SP3). That is, the first hole transport layer 510 may be formed in a connected structure among the neighboring sub pixels (SP1, SP2, SP3), whereby the first hole transport layer 510 may be overlapped with the first electrode 300 and the bank 400 while being provided on the first electrode 300 and the bank 400.

The first organic emission layer 520 is provided on the first hole transport layer 510, and the first organic emission layer 520 may be patterned in each sub pixel (SP1, SP2, SP3) area. That is, the first organic emission layer 520 may comprise an organic emission layer provided in the first sub pixel (SP1) and configured to emit first colored light, for example, red (R) colored light, an organic emission layer provided in the second sub pixel (SP2) and configured to emit second colored light, for example, green (G) colored light, and an organic emission layer provided in the third sub pixel (SP3) and configured to emit third colored light, for example, blue (B) colored light. The red organic emission layer, the green organic emission layer, and the blue organic emission layer are spaced apart from each other with the bank 400 therebetween.

The first electron transport layer 530 is provided on the first organic emission layer 520. Especially, the first electron transport layer 530 may be provided in each sub pixel (SP1, SP2, SP3) area, and the boundary area between each sub pixel (SP1, SP2, SP3). Thus, the first electron transport layer 530 may be overlapped with the bank 400. In the area overlapped with the bank 400, the first electron transport layer 530 may be in contact with the first hole transport layer 510.

The charge generation layer 600 is provided between the first emission layer 500 and the second emission layer 700. The charge generation layer 600 controls a charge balance between the first emission layer 500 and the second emission layer 700. The charge generation layer 600 includes an N-type charge generation layer 610 and a P-type charge generation layer 620.

The N-type charge generation layer 610 is provided on the first emission layer 500. Especially, the N-type charge generation layer 610 is provided in each sub pixel (SP1, SP2, SP3) area. Meanwhile, some portions of the N-type charge generation layer 610 may be overlapped with the bank 400.

The N-type charge generation layer 610 is provided to inject an electron into the first emission layer 500. The N-type charge generation layer may be formed of an organic layer doped with alkali metal such as Li, Na, K or Cs, or alkali earth metal such as Mg, Sr, Ba or Ra.

The P-type charge generation layer 620 is provided on the N-type charge generation layer 610. Especially, the P-type charge generation layer 620 is provided in each sub pixel (SP1, SP2, SP3) area. Meanwhile, some portions of the P-type charge generation layer 620 may be overlapped with the bank 400.

The P-type charge generation layer 620 is provided to inject a hole into the second emission layer 700. The P-type charge generation layer 620 may be formed of an organic material with a hole transport capacity which is doped with P-type dopant.

In the boundary area between each sub pixel (SP1, SP2, SP3), a P-type doping layer 615 is provided in the same layer as that of the N-type charge generation layer 610, an N-type doping layer 625 is provided in the same layer as that of the P-type charge generation layer 620. Thus, the P-type doping layer 615 and the N-type doping layer 625 are provided in the area overlapped with the bank 400, and the N-type doping layer 625 may be in contact with an upper surface of the P-type doping layer 615. That is, the N-type doping layer 625 may be overlapped with the P-type doping layer 615.

In detail, the P-type doping layer 615 is provided in each of the area between the N-type charge generation layer 610 of the first sub pixel (SP1) and the N-type charge generation layer 610 of the second sub pixel (SP2), the area between the N-type charge generation layer 610 of the second sub pixel (SP2) and the N-type charge generation layer 610 of the third sub pixel (SP3), and the area between the N-type charge generation layer 610 of the third sub pixel (SP3) and the N-type charge generation layer 610 of the first sub pixel (SP1). Accordingly, the respective N-type charge generation layers 610 patterned in the respective sub pixels (SP1, SP2, SP3) are spaced apart from each other with the P-type doping layer 615 therebetween.

According as the N-type charge generation layer 610 is formed in a connected structure among the sub pixels (SP1, SP2, SP3) while being provided on the entire boundary area between each sub pixel (SP1, SP2, SP3) as well as each sub pixel (SP1, SP2, SP3) area, charges generated in any one sub pixel (SP1, SP2, SP3) may be transferred to the neighboring other sub pixel (SP1, SP2, SP3) through the N-type charge generation layer 610, whereby it may cause a leakage current in the other sub pixel (SP1, SP2, SP3). According to one embodiment of the present disclosure, the N-type charge generation layers 610 provided in the respective sub pixels (SP1, SP2, SP3) are spaced apart from each other with the P-type doping layer 615 therebetween, whereby the P-type doping layer 615 may function as a barrier layer. Thus, it is possible to prevent charges generated in any one N-type charge generation layer 610 from being transferred to the neighboring other N-type charge generation layer 610, to thereby reduce a problem related with a leakage current.

The N-type charge generation layer 610 and the P-type doping layer 615 may be obtained by sequential steps of forming the N-type charge generation layer 610 on either at least a portion of the surface of the substrate 100 or an entire surface of the substrate 100, exposing some portions of the N-type charge generation layer 610 overlapped with the bank 400 while covering the other regions of the N-type charge generation layer 610 with a mask, and doping the exposed portions with P-type dopant. Accordingly, the N-type charge generation layer 610 and the P-type doping layer 615 may be provided in the same layer, and may be formed at the same or substantially the same thickness.

Also, the N-type doping layer 625 is provided in each of the area between the P-type charge generation layer 620 of the first sub pixel (SP1) and the P-type charge generation layer 620 of the second sub pixel (SP2), the area between the P-type charge generation layer 620 of the second sub pixel (SP2) and the P-type charge generation layer 620 of the third sub pixel (SP3), and the area between the P-type charge generation layer 620 of the third sub pixel (SP3) and the P-type charge generation layer 620 of the first sub pixel (SP1). Accordingly, the P-type charge generation layers 620 patterned in the respective sub pixels (SP1, SP2, SP3) may be spaced apart from each other with the N-type doping layer 625 therebetween. Thus, according to one embodiment of the present disclosure, the P-type charge generation layers 620 patterned in the respective sub pixels (SP1, SP2, SP3) are spaced apart from each other with the N-type doping layer 625 therebetween, whereby the N-type doping layer 625 functions as a barrier layer. Thus, it is possible to prevent charges generated in any one P-type charge generation layer 620 from being transferred to the neighboring other P-type charge generation layer 620, to thereby reduce a problem related with a leakage current.

The P-type charge generation layer 620 and the N-type doping layer 625 may be obtained by sequential steps of forming the P-type charge generation layer 620 on either at least a portion of the surface of the substrate 100 or an entire surface of the substrate 100, exposing some portions of the P-type charge generation layer 620 overlapped with the bank 400 while covering the other regions of the P-type charge generation layer 620 with a mask, and doping the exposed portions with N-type dopant. Accordingly, the P-type charge generation layer 620 and the N-type doping layer 625 may be provided in the same layer, and may be formed at the same or substantially the same thickness.

The second emission layer 700 is provided in the sub pixel (SP1, SP2, SP3) area on the charge generation layer 600. Also, at least some layers of the second emission layer 700 may be provided in the boundary area between each sub pixel (SP1, SP2, SP3) area on the N-type doping layer 625. That is, at least some layers of the second emission layer 700 may be provided in the area overlapped with the bank 400.

The second emission layer 700 includes a second hole transport layer 710, a second organic emission layer 720, and a second electron transport layer 730. Although not shown, the second emission layer 700 may further include an additionally-provided electron injection layer on the second electron transport layer 730.

The second hole transport layer 710 may be provided in both areas of each sub pixel (SP1, SP2, SP3) area and the boundary area between each sub pixel (SP1, SP2, SP3) area. That is, the second hole transport layer 710 may be formed in a connected structure between the neighboring sub pixels (SP1, SP2, SP3), whereby the second hole transport layer 710 may be provided on the P-type charge generation layer 620 and the N-type doping layer 625. In other words, the second hole transport layer 710 may be overlapped with the bank 400.

The second organic emission layer 720 is provided on the second hole transport layer 710. Especially, the second organic emission layer 720 may be patterned in each sub pixel (SP1, SP2, SP3) area. That is, the second organic emission layer 720 may comprise an organic emission layer provided in the first sub pixel (SP1) and configured to emit red (R) colored light, an organic emission layer provided in the second sub pixel (SP2) and configured to emit green (G) colored light, and an organic emission layer provided in the third sub pixel (SP3) and configured to emit blue (B) colored light. The red organic emission layer, the green organic emission layer, and the blue organic emission layer may be spaced apart from each other with the bank 400 therebetween.

The second electron transport layer 730 is provided on the second organic emission layer 720. Especially, the second electron transport layer 730 may be provided in both areas of each sub pixel (SP1, SP2, SP3) area and the boundary area between each sub pixel (SP1, SP2, SP3) area. Thus, the second electron transport layer 730 may be overlapped with the bank 400. In the area overlapped with the bank 400, the second electron transport layer 730 may contact the second hole transport layer 710.

The second electrode 800 is provided on the second emission layer 700. The second electrode 800 may function as a cathode of the electroluminescent display device. The second electrode 800 may be provided in each sub pixel (SP1, SP2, SP3) and also provided in the boundary area between each of the sub pixels (SP1, SP2, SP3).

The electroluminescent display device according to one embodiment of the present disclosure may be formed in a top emission type, whereby the second electrode 800 may include a transparent conductive material capable of upwardly transmitting light emitted from the first emission layer 500 and the second emission layer 700. Also, the second electrode 800 may be formed of a semi-transparent electrode, whereby it is possible to obtain a microcavity effect by each sub pixel (SP1, SP2, SP3). If the second electrode 800 is formed of the semi-transparent electrode, it is possible to obtain a microcavity effect by a repetitive reflection and re-reflection between the second electrode 800 and the first electrode 300, to thereby improve light efficiency.

Although not shown, an encapsulation layer may be additionally provided on the second electrode 800 in order to prevent a permeation of external moisture or oxygen. The encapsulation layer may be formed of an inorganic insulating material, or may be provided in a structure obtained by alternately depositing an inorganic insulating material and an organic insulating material, but not limited to this structure.

Figure 2A:
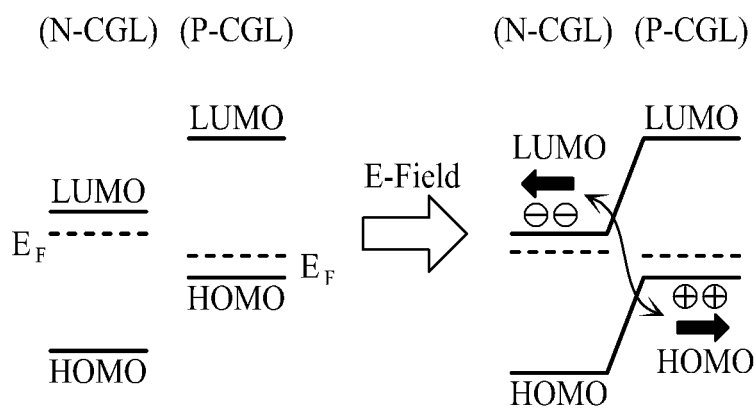
FIGS. 2A to 2C illustrate a LUMO level and a HOMO level in a charge generation layer according to one embodiment of the present disclosure.
Figure 2B:
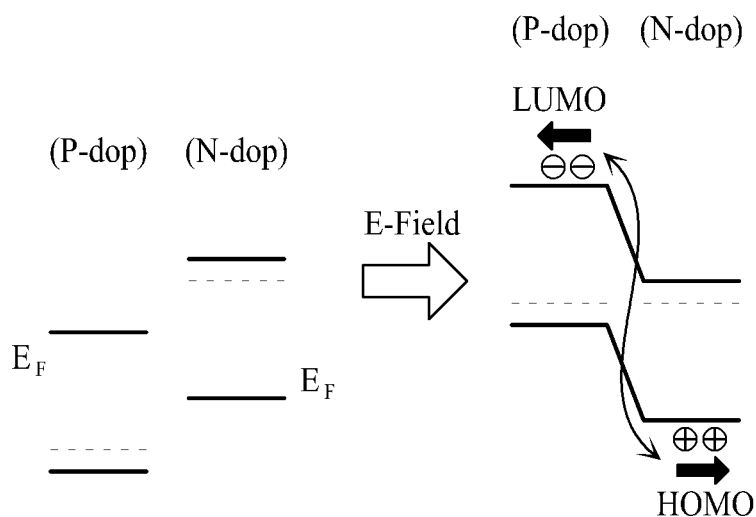
Figure 2C:
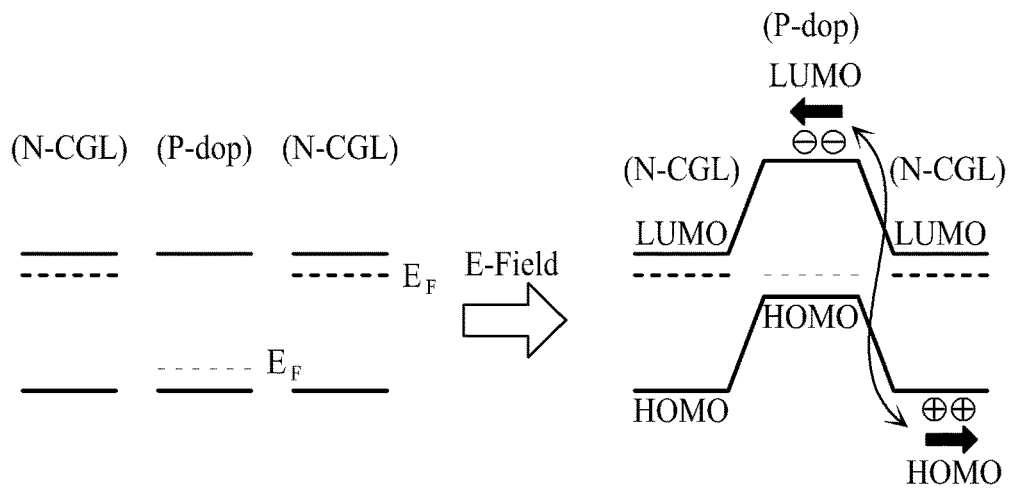

FIGS. 2A to 2C illustrate a LUMO level and a HOMO level of the charge generation layer according to one embodiment of the present disclosure. FIG. 2A illustrates a charge mobility to ① arrow direction in FIG. 1, FIG. 2B illustrates a charge mobility to ② arrow direction in FIG. 1, and FIG. 2C illustrates a charge mobility to ③ arrow direction in FIG. 1. In FIGS. 2A to 2C, an energy level before an electric field (E-filed) is applied thereto is shown in the left side, and an energy level after an electric field (E-field) is applied thereto is shown in the right side. Also, an energy level shown in a dotted line corresponds to a fermi level.

As shown in FIG. 2A, in each sub pixel (SP1, SP2, SP3) area, there is a small difference of fermi level between the N-type charge generation layer (N-CGL) and the P-type charge generation layer (P-CGL) before an electric field (E-field) is applied thereto. Thus, if the fermi level is identically maintained even after the application of an electric field (E-field), charges may be smoothly transferred owing to the small difference of energy level between the N-type charge generation layer (N-CGL) and the P-type charge generation layer (P-CGL). Accordingly, in FIG. 1, a charge transfer is smoothly carried out in the sub pixel (SP1, SP2, SP3) area, whereby it facilitates a light emission in the first emission layer 500 and the second emission layer 700.

As shown in FIG. 2B, in the boundary area between each sub pixel (SP1, SP2, SP3) area, there is a large difference of fermi level between the P-type doping layer (P-dop) and the N-type doping layer (N-dop) before an electric field (E-field) is applied thereto. Thus, if the fermi level is identically maintained even after the application of an electric field (E-field), charges are not smoothly transferred due to the large difference of energy level between the P-type doping layer (P-dop) and the N-type doping layer (N-dop). Accordingly, in FIG. 1, a charge transfer is not carried out smoothly in the boundary area between each sub pixel (SP1, SP2, SP3) area, whereby it is not easy to make a light emission in the first emission layer 500 and the second emission layer 700.

As shown in FIG. 2C, in the boundary area between each sub pixel (SP1, SP2, SP3) area, there is a large difference of fermi level between the N-type charge generation layer (N-CGL) and the P-type doping layer (P-dop) before an electric field (E-field) is applied thereto. Thus, if the fermi level is identically maintained even after the application of an electric field (E-field), charges are not smoothly transferred due to the large difference of energy level between the N-type charge generation layer (N-CGL) and the P-type doping layer (P-dop). Accordingly, in FIG. 1, charges are not transferred smoothly to left and right directions in the boundary area between each sub pixel (SP1, SP2, SP3) area, whereby it is possible to prevent a leakage current.

Figure 3:
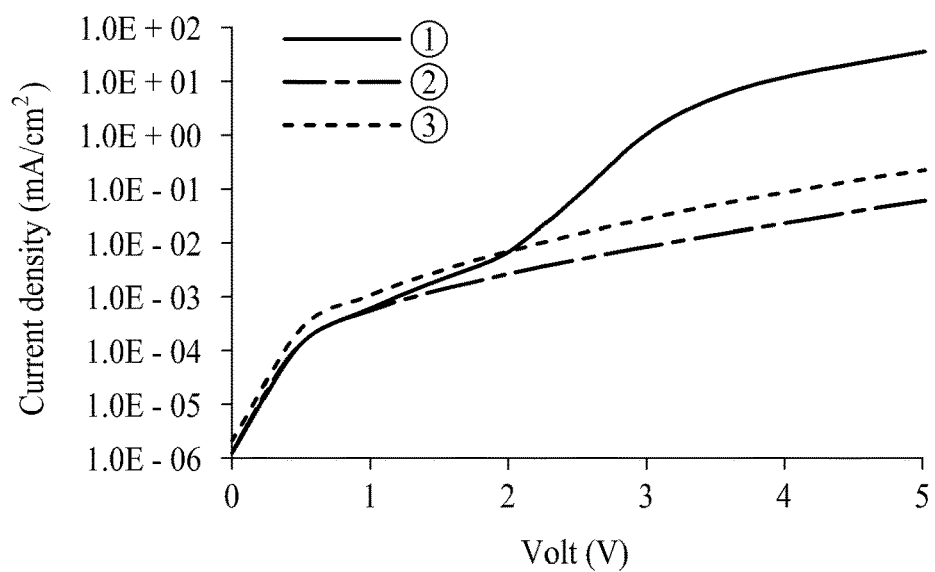
FIG. 3 is a graph of a current density change in accordance with a driving voltage according to one embodiment of the present disclosure.

FIG. 3 is a graph of a current density change in accordance with a driving voltage according to one embodiment of the present disclosure. FIG. 3 is a graph of a current density change according to a driving voltage in the ① arrow direction, the ② arrow direction, and the ③ arrow direction of FIG. 1.

As shown in FIG. 3, in the voltage less than 2 volts, a current density change is similar in the ① arrow direction, the ② arrow direction, and the ③ arrow direction. However, in the voltage of 2 volts or more than 2 volts, a high current density is shown only in the ① arrow direction, and a low current density is shown in the ② arrow direction and the ③ arrow direction.

Accordingly, in the voltage of 2 volts or more than 2 volts, a light emission of the first emission layer 500 and the second emission layer 700 is easily carried out in the sub pixel (SP1, SP2, SP3) area, and a light emission of the first emission layer 500 and the second emission layer 700 is not easily carried out in the boundary area between each sub pixel (SP1, SP2, SP3) area, whereby charges are not transferred smoothly to left and right directions in the boundary area between each sub pixel (SP1, SP2, SP3) area, whereby it is possible to prevent a leakage current.

Figure 4:
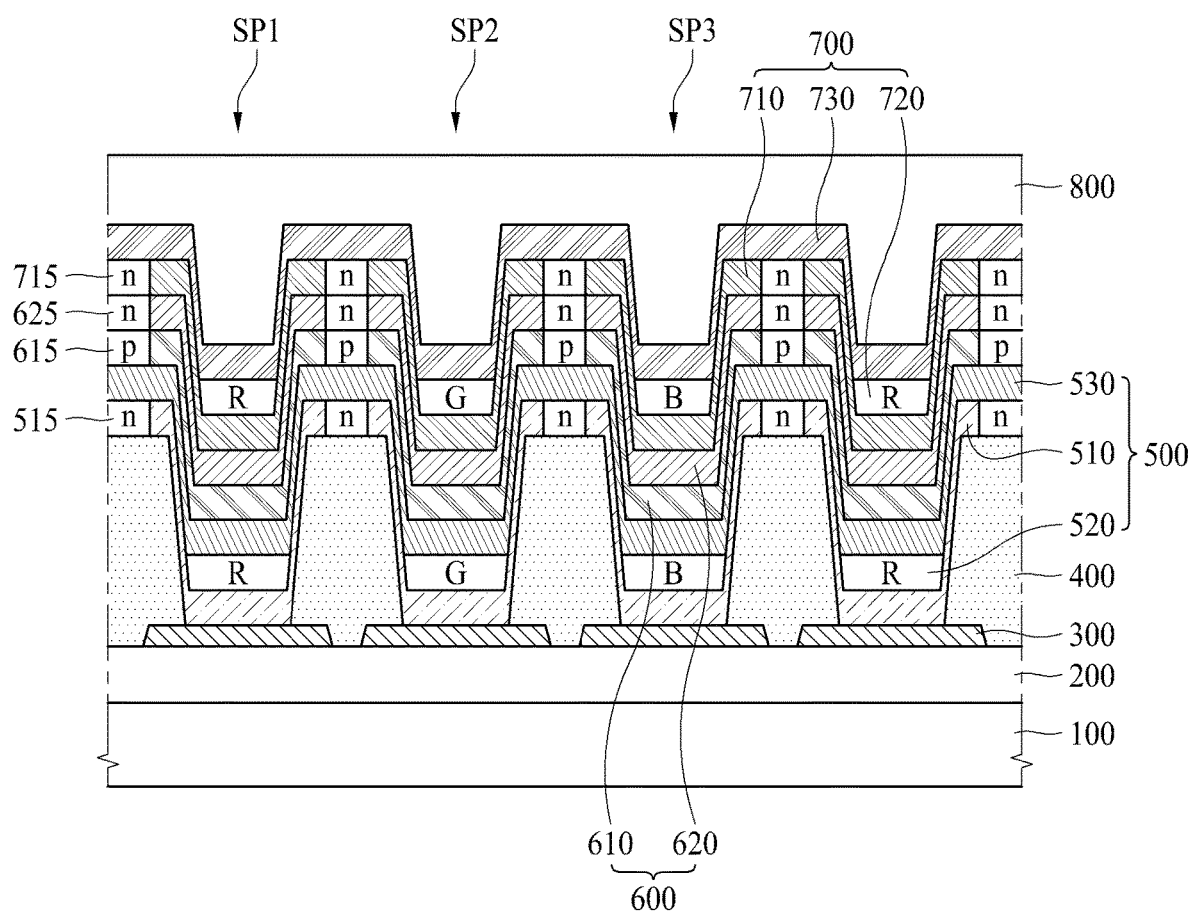
FIG. 4 is a schematic cross sectional view illustrating an electroluminescent display device according to another embodiment of the present disclosure.

FIG. 4 is a schematic cross sectional view illustrating an electroluminescent display device according to another embodiment of the present disclosure. Except a structure change in a first hole transport layer 510 and a second hole transport layer 710, the electroluminescent display device of FIG. 4 is identical in structure to the aforementioned electroluminescent display device of FIG. 1. Accordingly, the same elements are denoted by the same reference numerals, and only the different structures will be described in detail as follows.

As shown in FIG. 4, a first hole transport layer 510 is provided in each sub pixel (SP1, SP2, SP3) area. In the boundary area between each sub pixel (SP1, SP2, SP3), an N-type doping layer 515 is provided in the same layer as that of the first hole transport layer 510. That is, the N-type doping layer 515 is provided in the area overlapped with a bank 400. Also, the N-type doping layer 515 may be overlapped with the aforementioned N-type doping layer 625 and P-type doping layer 615. Also, a portion of the first hole transport layer 510 may be overlapped with the bank 400.

In detail, the N-type doping layer 515 is provided in each of the area between the first hole transport layer 510 of the first sub pixel (SP1) and the first hole transport layer 510 of the second sub pixel (SP2), the area between the first hole transport layer 510 of the second sub pixel (SP2) and the first hole transport layer 510 of the third sub pixel (SP3), and the area between the first hole transport layer 510 of the third sub pixel (SP3) and the first hole transport layer 510 of the first sub pixel (SP1). Accordingly, the first hole transport layers 510 patterned in the respective sub pixels (SP1, SP2, SP3) may be spaced apart from each other with the N-type doping layer 515 therebetween.

In this case, the first hole transport layer 510 may be formed of an organic layer with conductivity, which is doped with P-type dopant. If the first hole transport layer 510 is provided in the entire area comprising the boundary area between each sub pixel (SP1, SP2, SP3) as well as each sub pixel (SP1, SP2, SP3), and is formed in a connected structure among the sub pixels (SP1, SP2, SP3), charges generated in any one sub pixel (SP1, SP2, SP3) may be transferred to another neighboring sub pixel (SP1, SP2, SP3) through the first hole transport layer 510, whereby it may have a problem related with a leakage current in another neighboring sub pixel (SP1, SP2, SP3). According to another embodiment of the present disclosure, the first hole transport layers 510 patterned in the respective sub pixels (SP1, SP2, SP3) may be spaced apart from each other with the N-type doping layer 515 therebetween, whereby the N-type doping layer 515 functions as a barrier layer. Thus, it is possible to prevent charges generated in any one sub pixel (SP1, SP2, SP3) from being transferred to another neighboring sub pixel (SP1, SP2, SP3), to thereby reduce a leakage current problem.

The first hole transport layer 510 and the N-type doping layer 515 may be obtained by sequential steps of forming the first hole transport layer 510 on either at least a portion of the surface of the substrate 100 or an entire surface of the substrate 100, exposing some portions of the first hole transport layer 510 overlapped with the bank 400 while covering the other regions of the first hole transport layer 510 with a mask, and doping the exposed portions with N-type dopant. Accordingly, the first hole transport layer 510 and the N-type doping layer 515 may be provided in the same layer, and may be formed at the same or substantially the same thickness.

Also, a second hole transport layer 710 is provided in each sub pixel (SP1, SP2, SP3) area. In the boundary area between each sub pixel (SP1, SP2, SP3), an N-type doping layer 715 is provided in the same layer as that of the second hole transport layer 710. That is, the N-type doping layer 715 is provided in the area overlapped with the bank 400. Also, a portion of the second hole transport layer 710 may be overlapped with the bank 400.

In detail, the N-type doping layer 715 is provided in each of the area between the second hole transport layer 710 of the first sub pixel (SP1) and the second hole transport layer 710 of the second sub pixel (SP2), the area between the second hole transport layer 710 of the second sub pixel (SP2) and the second hole transport layer 710 of the third sub pixel (SP3), and the area between the second hole transport layer 710 of the third sub pixel (SP3) and the second hole transport layer 710 of the first sub pixel (SP1). Accordingly, the second hole transport layers 710 patterned in the respective sub pixels (SP1, SP2, SP3) may be spaced apart from each other with the N-type doping layer 715 therebetween.

In this case, the second hole transport layer 710 may be formed of an organic layer with conductivity, which is doped with P-type dopant. According to another embodiment of the present disclosure, the second hole transport layers 710 patterned in the respective sub pixels (SP1, SP2, SP3) may be spaced apart from each other with the N-type doping layer 715 therebetween, whereby the N-type doping layer 715 functions as a barrier layer. Thus, it is possible to prevent charges generated in the second hole transport layer 710 of any one sub pixel from being transferred to the second hole transport layer 710 of a neighboring another sub pixel, to thereby reduce a leakage current problem.

The second hole transport layer 710 and the N-type doping layer 715 may be obtained by sequential steps of forming the second hole transport layer 710 on either at least a portion of the surface of the substrate 100 or an entire surface of the substrate 100, exposing some portions of the second hole transport layer 710 overlapped with the bank 400 while covering the other regions of the second hole transport layer 710 with a mask, and doping the exposed portions with N-type dopant. Accordingly, the second hole transport layer 710 and the N-type doping layer 715 may be provided in the same layer, and may be formed at the same or substantially the same thickness.

Meanwhile, any one of the first hole transport layer 510 and the second hole transport layer 710 may be formed in a consecutively connected structure in the respective sub pixels (SP1, SP2, SP3) and the boundary area between each sub pixel (SP1, SP2, SP3) as shown in FIG. 1.

Figure 5:
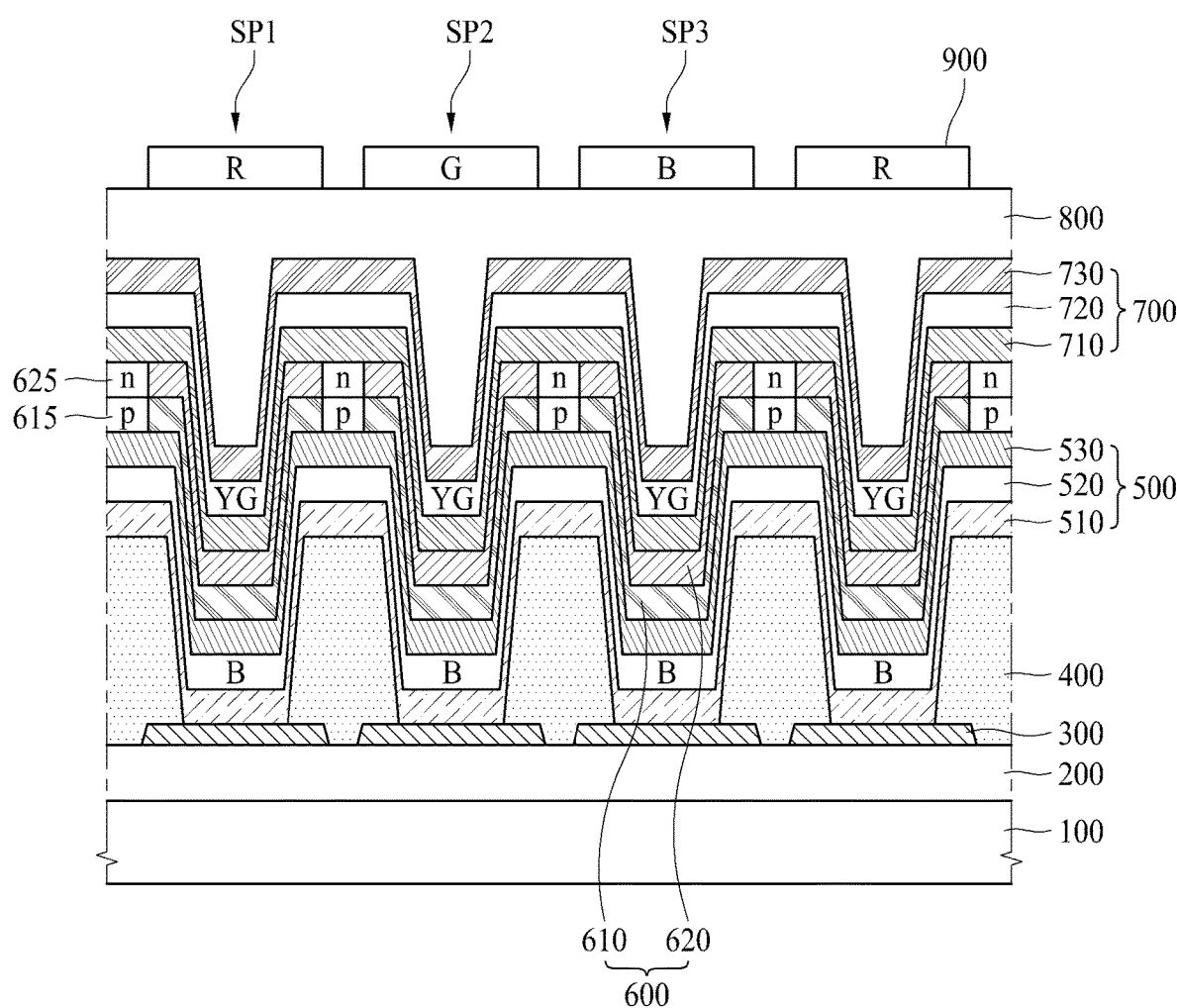
FIG. 5 is a schematic cross sectional view illustrating an electroluminescent display device according to another embodiment of the present disclosure.

FIG. 5 is a schematic cross sectional view illustrating an electroluminescent display device according to another embodiment of the present disclosure. The electroluminescent display device of FIG. 5 is different in structure of a first organic emission layer 520 and a second organic emission layer 720 from the electroluminescent display device of FIG. 1. Accordingly, the same elements are denoted by the same reference numerals, and only the different structures will be described in detail as follows.

As shown in FIG. 5, a first organic emission layer 520 is provided between a first hole transport layer 510 and a first electron transport layer 530, and the first organic emission layer 520 is identical in structure to the first hole transport layer 510 and the first electron transport layer 530. That is, the first organic emission layer 520 is provided both in each sub pixel (SP1, SP2, SP3) area and the boundary area between each sub pixel (SP1, SP2, SP3) area.

Also, a second organic emission layer 720 is provided between a second hole transport layer 710 and a second electron transport layer 730, and the second organic emission layer 720 is identical in structure to the second hole transport layer 710 and the second electron transport layer 730. That is, the second organic emission layer 720 is provided both in each sub pixel (SP1, SP2, SP3) area and the boundary area between each sub pixel (SP1, SP2, SP3) area.

In this case, the first organic emission layer 520 is configured to emit blue (B) colored light, and the second organic emission layer 720 is configured to emit yellowish green (YG) colored light. Accordingly, the blue (B) colored light emitted from the first organic emission layer 5210 is mixed with the yellowish green (YG) colored light emitted from the second organic emission layer 720, to thereby make white colored light. According as the white colored light is emitted, a color filter 900 may be additionally provided in each sub pixel (SP1, SP2, SP3). For example, a red (R) color filter 900 is provided in the first sub pixel (SP1), a green (G) color filter 900 is provided in the second sub pixel (SP2), and a blue (B) color filter 900 is provided in the third sub pixel (SP3). The color filter 900 may be provided on a second electrode 800. Although not shown, an encapsulation layer may be additionally provided on the second electrode 800. In this case, the color filter 900 may be provided on the encapsulation layer.

Meanwhile, the first organic emission layer 520 is provided to emit yellowish green (YG) colored light, and the second organic emission layer 720 may be provided to emit blue (B) colored light.

Figure 6:
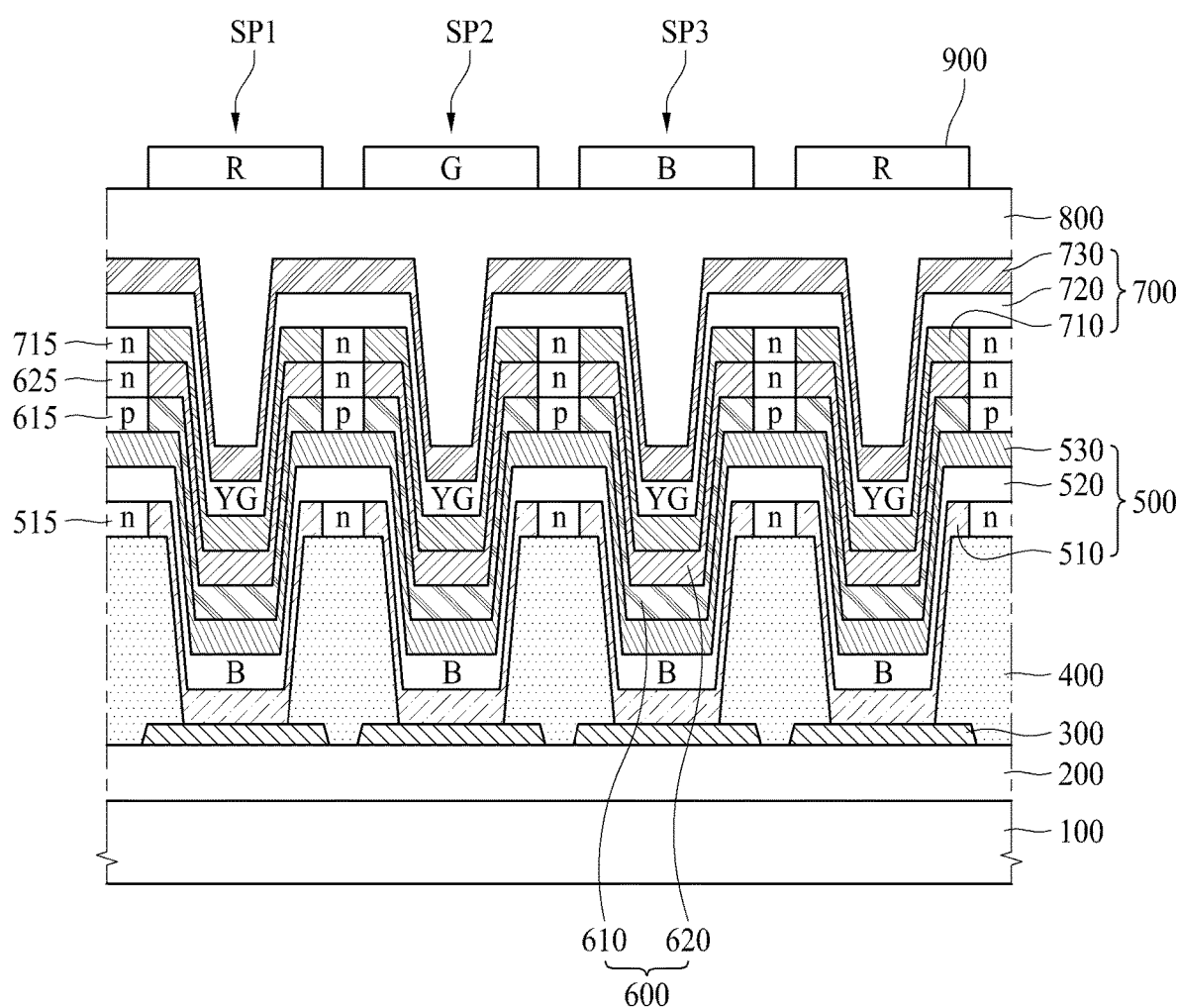
FIG. 6 is a schematic cross sectional view illustrating an electroluminescent display device according to another embodiment of the present disclosure.

FIG. 6 is a schematic cross sectional view illustrating an electroluminescent display device according to another embodiment of the present disclosure. The electroluminescent display device of FIG. 6 is different in structure of a first organic emission layer 520 and a second organic emission layer 720 from the electroluminescent display device of FIG. 4. Accordingly, the same elements are denoted by the same reference numerals, and only the different structures will be described in detail as follows.

As shown in FIG. 6, a first organic emission layer 520 is provided both in each sub pixel (SP1, SP2, SP3) area and the boundary area between each sub pixel (SP1, SP2, SP3) area.

Also, a second organic emission layer 720 is provided both in each sub pixel (SP1, SP2, SP3) area and the boundary area between each sub pixel (SP1, SP2, SP3) area.

In this case, the first organic emission layer 520 is configured to emit blue (B) colored light, and the second organic emission layer 720 may be configured to emit yellowish green (YG) colored light. Accordingly, the blue (B) colored light emitted from the first emission layer 500 is mixed with the yellowish green (YG) colored light emitted from the second emission layer 700, to thereby emit white colored light. According as the white colored light is emitted, a color filter 900 may be additionally provided in each sub pixel (SP1, SP2, SP3). For example, a red (R) color filter 900 is provided in the first sub pixel (SP1), a green (G) color filter 900 is provided in the second sub pixel (SP2), and a blue (B) color filter 900 is provided in the third sub pixel (SP3). The color filter 900 may be provided on a second electrode 800. Although not shown, an encapsulation layer may be additionally provided on the second electrode 800. In this case, the color filter 900 may be provided on the encapsulation layer.

Meanwhile, the first organic emission layer 520 may be provided to emit yellowish green (YG) colored light, and the second organic emission layer 720 may be provided to emit blue (B) colored light.

Although not shown, another embodiment of the present disclosure may include a first emission layer configured to emit red colored light, a second emission layer configured to emit green colored light, a third emission layer configured to emit blue colored light, a first charge generation layer provided between the first emission layer and the second emission layer, and a second charge generation layer provided between the second emission layer and the third emission layer. At this time, in the same manner as the charge generation layer 600 of the aforementioned embodiment, each of the first charge generation layer and the second charge generation layer may include respective N-type charge generation layers 610 which are spaced apart from each other with a P-type doping layer 615 therebetween, and respective P-type charge generation layers 620 which are spaced apart from each other with an N-type doping layer 625 therebetween. Also, in the same manner as the aforementioned embodiment, at least one of the first to third emission layers may include hole transport layers 510 and 710 which are spaced apart from each other with an N-type doping layer 515 and 715 therebetween.

Also, in another embodiment of the present disclosure, one emission layer without a charge generation layer may be provided between a first electrode 300 and a second electrode 800, and the emission layer may include hole transport layers 510 and 710 which are spaced apart from each other with an N-type doping layer 515 and 715 therebetween, in the same manner as the aforementioned embodiment.

Figure 7:
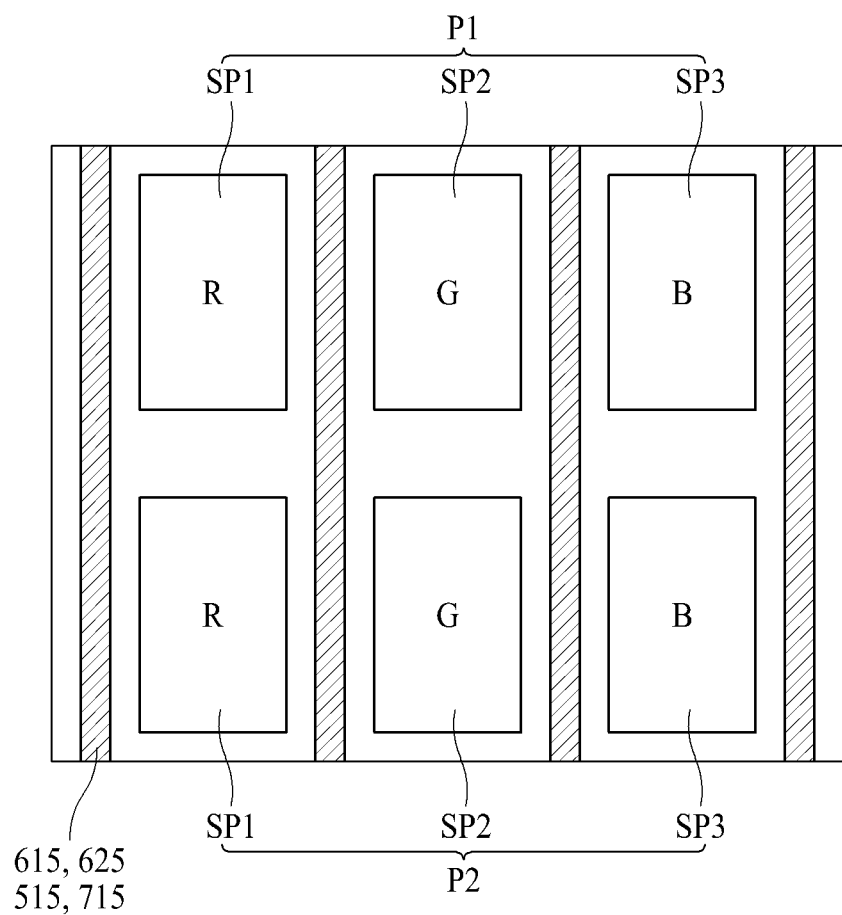
FIG. 7 is a schematic plan view illustrating the electroluminescent display device according to one embodiment of the present disclosure.

FIG. 7 is a schematic plan view illustrating the electroluminescent display device according to one embodiment of the present disclosure.

As shown in FIG. 7, the electroluminescent display device according to one may include a first pixel (P1) and a second pixel (P2) which are close to each other in up and down directions. Each of the first pixel (P1) and the second pixel (P2) includes a first sub pixel (SP1), a second sub pixel (SP2), and a third sub pixel (SP3). The first sub pixel (SP1) of the first pixel (P1) and the first sub pixel (SP1) of the second sub pixel (SP2) are arranged in the same column, the second sub pixel (SP2) of the first pixel (P1) and the second sub pixel (SP2) of the second pixel (P2) are arranged in the same column, and the third sub pixel (SP3) of the first pixel (P1) and the third sub pixel (SP3) of the second pixel (P2) are arranged in the same column.

In this case, the N-type doping layer 515, 625 and 715 and the P-type doping layer 615, which are described in the aforementioned various embodiments of the present disclosure, are provided in the boundary area between the first sub pixel (SP1) and the second sub pixel (SP2) and the boundary area between the second sub pixel (SP2) and the third sub pixel (SP3). That is, the N-type doping layer 515 provided between the first hole transport layers 510, the N-type doping layer 625 provided between the P-type charge generation layers 620, the N-type doping layer 715 provided between the second hole transport layers 710, and the P-type doping layer 615 provided between the N-type charge generation layers 610 are provided in the boundary area between each of the sub pixels (SP1, SP2, SP3).

In this case, the N-type doping layer 515, 625 and 715 and the P-type doping layer 615 may be consecutively provided between the first pixel (P1) and the second pixel (P2), whereby it is possible to form an entire stripe structure.

Figure 8:
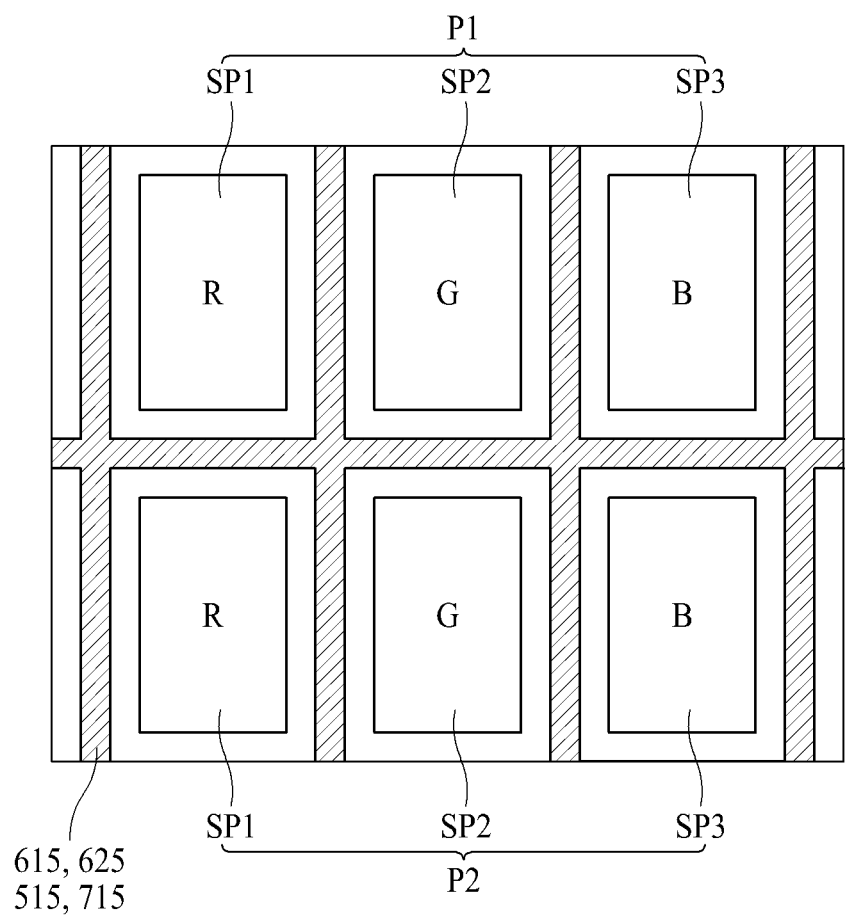
FIG. 8 is a schematic plan view illustrating the electroluminescent display device according to another embodiment of the present disclosure.

FIG. 8 is a schematic plan view illustrating the electroluminescent display device according to another embodiment of the present disclosure. According as the N-type doping layer 515, 625 and 715 and the P-type doping layer 615 are additionally provided in the boundary area between the first pixel (P1) and the second pixel (P2), the electroluminescent display device of FIG. 8 is different from the electroluminescent display device of FIG. 7. Hereinafter, only the different structures will be described in detail.

The first sub pixel (SP1) of the first pixel (P1) and the first sub pixel (SP1) of the second pixel (P2), which are arranged in the same column, may be configured to emit the same first color light, for example, red (R) colored light. In this case, even though a leakage current is generated between the first sub pixel (SP1) of the first pixel (P1) and the first sub pixel (SP1) of the second pixel (P2), a deterioration of picture quality is not significant.

Also, the second sub pixel (SP2) of the first pixel (P1) and the second sub pixel (SP2) of the second pixel (P2), which are arranged in the same column, may be configured to emit the same second color light, for example, green (G) colored light. In this case, even though a leakage current is generated between the second sub pixel (SP2) of the first pixel (P1) and the second sub pixel (SP2) of the second pixel (P2), a deterioration of picture quality is not significant.

Also, the third sub pixel (SP3) of the first pixel (P1) and the third sub pixel (SP3) of the second pixel (P2), which are arranged in the same column, may be configured to emit the same third color light, for example, blue (B) colored light. In this case, even though a leakage current is generated between the third sub pixel (SP3) of the first pixel (P1) and the third sub pixel (SP3) of the second pixel (P2), a deterioration of picture quality is not significant.

Accordingly, in case of FIG. 7, the N-type doping layer 515, 625 and 715 and the P-type doping layer 615, which function as a barrier layer, are not provided in the boundary area between the first sub pixel (SP1) of the first pixel (P1) and the first sub pixel (SP1) of the second pixel (P2), the boundary area between the second sub pixel (SP2) of the first pixel (P1) and the second sub pixel (SP2) of the second pixel (P2), and the boundary area between the third sub pixel (SP3) of the first pixel (P1) and the third sub pixel (SP3) of the second pixel (P2).

Meanwhile, in case of FIG. 8, the N-type doping layer 515, 625 and 715 and the P-type doping layer 615 are provided in the boundary area between the first sub pixel (SP1) of the first pixel (P1) and the first sub pixel (SP1) of the second pixel (P2), the boundary area between the second sub pixel (SP2) of the first pixel (P1) and the second sub pixel (SP2) of the second pixel (P2), and the boundary area between the third sub pixel (SP3) of the first pixel (P1) and the third sub pixel (SP3) of the second pixel (P2), to thereby prevent a leakage current between the first pixel (P1) and the second pixel (P2).

Accordingly, in case of FIG. 8, the N-type doping layer 515, 625 and 715 and the P-type doping layer 615 may be provided in a matrix configuration which is identical to that of the aforementioned bank 400.

Figure 9A:
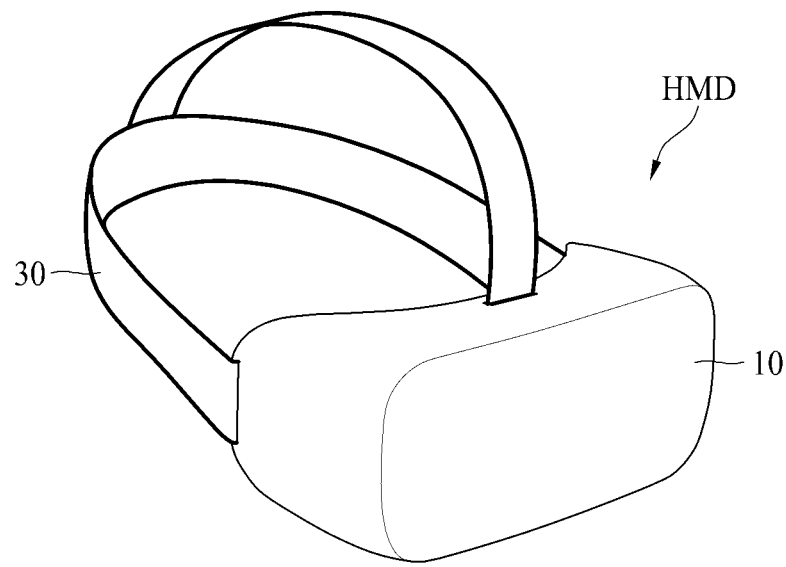
FIGS. 9A to 9C illustrate an electroluminescent display device according to another embodiment of the present disclosure, which relate to a head mounted display (HMD) device.
Figure 9B:
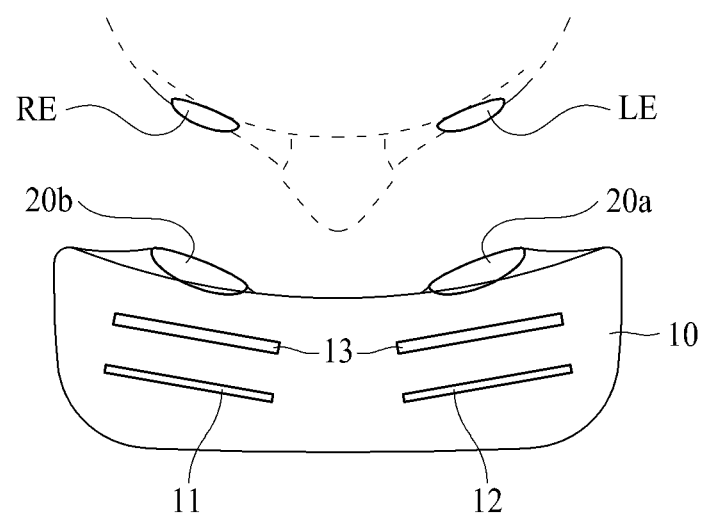
Figure 9C:
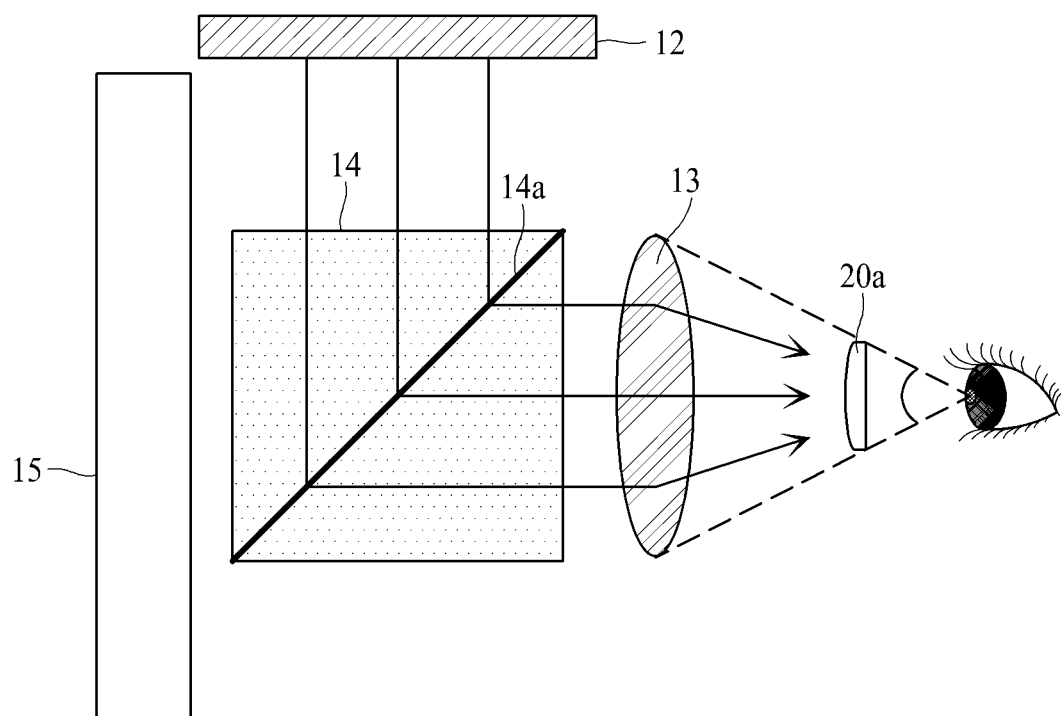

FIGS. 9A to 9C relate to an electroluminescent display device according to another embodiment of the present disclosure and relate to a head-mounted display (HMD) apparatus. FIG. 9A is a schematic perspective view, FIG. 9B is a schematic plan view of a virtual reality (VR) structure, and FIG. 9C is a schematic cross-sectional view of an augmented reality (AR) structure.

As seen in FIG. 9A, the HMD apparatus according to the present disclosure may include an accommodating case 10 and a head-mounted band 30.

The accommodating case 10 may accommodate elements such as a display apparatus, a lens array, and an eyepiece lens.

The head-mounted band 30 may be fixed to the accommodating case 10. The head-mounted band 30 is illustrated as being provided to surround an upper surface and both side surfaces of a user, but is not limited thereto. The head-mounted band 30 may fix the HMD apparatus to a head of a user and may be replaced by a glasses frame type structure or a helmet type structure.

As seen in FIG. 9B, an HMD apparatus having the VR structure according to the present disclosure may include a left-eye display apparatus 12, a right-eye display apparatus 11, a lens array 13, a left-eye eyepiece lens 20a, and a right-eye eyepiece lens 20b.

The left-eye display apparatus 12, the right-eye display apparatus 11, the lens array 13, the left-eye eyepiece lens 20a, and the right-eye eyepiece lens 20b may be accommodated into the accommodating case 10.

The left-eye display apparatus 12 and the right-eye display apparatus 11 may display the same image, and in this case, a user may watch a two-dimensional (2D) image. Alternatively, the left-eye display apparatus 12 may display a left-eye image, and the right-eye display apparatus 11 may display a right-eye image. Each of the left-eye display apparatus 12 and the right-eye display apparatus 11 may be configured as the electroluminescent display device as explained above. In this case, an upper portion corresponding to a surface displaying an image may face the lens array 13.

The lens array 13 may be spaced apart from each of the left-eye eyepiece lens 20a and the left-eye display apparatus 12 and may be provided between the left-eye eyepiece lens 20a and the left-eye display apparatus 12. That is, the lens array 13 may be disposed in front of the left-eye eyepiece lens 20a and behind the left-eye display apparatus 12. Also, the lens array 13 may be spaced apart from each of the right-eye eyepiece lens 20b and the right-eye display apparatus 11 and may be provided between the right-eye eyepiece lens 20b and the right-eye display apparatus 11. That is, the lens array 13 may be disposed in front of the right-eye eyepiece lens 20b and behind the right-eye display apparatus 11.

The lens array 13 may be a micro-lens array. The lens array 13 may be replaced by a pin hole array. By using the lens array 13, an image displayed by the left-eye display apparatus 12 or the right-eye display apparatus 11 may be zoomed in by a certain magnification, and thus, a zoomed-in image may be seen by a user.

A left eye LE of a user may be located at the left-eye eyepiece lens 20a, and a right eye RE of the user may be located at the right-eye eyepiece lens 20b.

As seen in FIG. 9C, an HMD apparatus having the AR structure according to the present disclosure may include a left-eye display apparatus 12, a lens array 13, a left-eye eyepiece lens 20a, a transmissive reflection part 14, and a transmissive window 15. In FIG. 9C, for convenience, only left-eye elements are illustrated, and right-eye elements may be the same as the left-eye elements.

The left-eye display apparatus 12, the lens array 13, the left-eye eyepiece lens 20a, the transmissive reflection part 14, and the transmissive window 15 may be accommodated into the accommodating case 10.

The left-eye display apparatus 12 may be disposed in one side (for example, an upper side) of the transmissive reflection part 14 without covering the transmissive window 15. Therefore, the left-eye display apparatus 12 may provide an image to the transmissive reflection part 14 without covering an external background seen through the transmissive window 15.

The left-eye display apparatus 12 may be configured as the electroluminescent display device as explained above. In this case, an upper portion corresponding to a surface displaying an image may face the transmissive reflection part 14.

The lens array 13 may be provided between the left-eye eyepiece lens 20a and the transmissive reflection part 14.

The left eye of the user may be located at the left-eye eyepiece lens 20a.

The transmissive reflection part 14 may be disposed between the lens array 13 and the transmissive window 15. The transmissive reflection part 14 may include a reflection surface 14a which transmits a portion of light and reflects the other portion of the light. The reflection surface 14a may be provided so that an image displayed by the left-eye display apparatus 12 travels to the lens array 13. Accordingly, the user may see, through the transmissive window 15, all of the external background and the image displayed by the left-eye display apparatus 12. That is, the user may see one image which includes a real background and a virtual image, and thus, AR may be implemented.

The transmissive window 15 may be disposed in front of the transmissive reflection part 14.

According to one embodiment of the present disclosure, the organic layer provided in the first sub pixel and the organic layer provided in the second sub pixel are spaced apart from each other with the doping layer provided in the boundary area between the first sub pixel and the second sub pixel, and the doping layer is doped with dopant whose polarity is opposite to that of the organic layer, whereby the doping layer functions as a barrier layer. Accordingly, it is possible to prevent a leakage current between the first sub pixel and the second sub pixel which are adjacent to each other through the organic layer, to thereby prevent a deterioration of picture quality caused by the leakage current.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is intended to include all variations or modifications, and equivalent concept that falls within the teachings of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electroluminescent display device, comprising:
   a first sub pixel and a second sub pixel on a substrate;
   a bank between the first sub pixel and the second sub pixel, the bank having a top surface and side surfaces extending from the top surface;
   a first electrode in each of the first sub pixel and the second sub pixel on the substrate;
   a first emission layer on the first electrode and on the bank;
   a charge generation layer on the first emission layer and on the bank, the charge generation layer including:
      an N-type charge generation layer including a P-type doping layer; and
      a P-type charge generation layer on the N-type charge generation layer;
   a second emission layer on the charge generation layer and on the bank; and
   a second electrode on the second emission layer and on the bank,
   wherein the P-type doping layer overlaps the bank and the P-type doping layer is spaced apart from the top surface of the bank.

2. The electroluminescent display device according to claim 1, wherein the P-type doping layer has the same or substantially the same thickness as that of the N-type charge generation layer.

3. The electroluminescent display device according to claim 1, wherein the P-type charge generation layer includes an N-type doping layer, and
   wherein the N-type doping layer is on the P-type doping layer and the N-type doping layer overlaps the bank.

4. The electroluminescent display device according to claim 3, wherein the N-type doping layer has the same or substantially the same thickness as that of the P-type charge generation layer.

5. The electroluminescent display device according to claim 3, wherein the N-type doping layer contacts the P-type doping layer.

6. The electroluminescent display device according to claim 3, wherein a lateral dimension of the N-type doping layer and a corresponding lateral dimension of the P-type doping layer are substantially the same as each other.

7. The electroluminescent display device according to claim 1, wherein the first emission layer includes a first hole transport layer,
   wherein the first hole transport layer includes an N-type doping layer, and
   wherein the N-type doping layer in the first hole transport layer contacts the top surface of the bank.

8. The electroluminescent display device according to claim 7, wherein the N-type doping layer in the first hole transport layer overlaps with the P-type doping layer in the N-type charge generation layer from a plan view.

9. The electroluminescent display device according to claim 3, wherein the second emission layer includes a second hole transport layer,
   wherein the second hole transport layer includes an N-type doping layer, and
   wherein the N-type doping layer in the second hole transport layer contacts the N-type doping layer in the P-type charge generation layer.

10. The electroluminescent display device according to claim 9, wherein the N-type doping layer in the second hole transport layer overlaps with the N-type doping layer in the P-type charge generation layer from a plan view.

11. The electroluminescent display device according to claim 9, wherein the N-type doping layer in the second hole transport layer has the same or substantially the same thickness as that of the second hole transport layer.

12. The electroluminescent display device according to claim 1, wherein the second electrode has a planar top surface.

13. An electroluminescent display device, comprising:
    a substrate having thereon a first sub pixel, a second sub pixel, and a third sub pixel, the second sub pixel adjacent to the first sub pixel in a first direction, the third sub pixel adjacent to the first sub pixel in a second direction transverse to the first direction;
    one or more N-type doping layers at a boundary area between the first sub pixel and the second sub pixel;
    a P-type doping layer at the boundary area between the first sub pixel and the second sub pixel, the P-type doping layer overlapping the one or more N-type doping layers;
    a first electrode in each of the first sub pixel, the second sub pixel, and the third sub pixel on the substrate;
    a first emission layer on the first electrode;
    a second emission layer on the first emission layer;
    a charge generation layer including an N-type charge generation layer on the first emission layer and a P-type charge generation layer on the N-type charge generation layer, the charge generation layer between the first emission layer and the second emission layer;
    a hole transport layer included in the first emission layer; and
    a second electrode on the second emission layer,
    wherein the hole transport layer includes a first N-type doping layer of the one or more N-type doping layers, and
    wherein the P-type charge generation layer includes a second N-type doping layer of the one or more N-type doping layers.

14. The electroluminescent display device according to claim 13, wherein the hole transport layer contacts the first electrode.

15. The electroluminescent display device according to claim 13, wherein the one or more N-type doping layers are further disposed at a boundary area between the first sub pixel and the third sub pixel.

16. The electroluminescent display device according to claim 15, wherein the P-type doping layer is further disposed at the boundary area between the first sub pixel and the third sub pixel, and
    wherein the P-type doping layer overlaps the one or more N-type doping layers at the boundary area between the first sub pixel and the third sub pixel.

17. The electroluminescent display device according to claim 13, further comprising:
- a bank at the boundary area between the first sub pixel and the second sub pixel, the bank having a top surface and side surfaces extending from the top surface;
- wherein the second emission layer includes a second organic emission layer disposed above the top surface of the bank.

18. The electroluminescent display device according to claim 17, wherein the first emission layer emits a first color and the second emission layer emits the first color.

19. The electroluminescent display device according to claim 17, further comprising:
- a color filter on the second electrode,
- wherein the first emission layer emits a first color and the second emission layer emits a second color,
- wherein, in operation, the first color and the second color mix and emits a white color, and
- wherein the color filter is disposed to overlap with the emitted white color light.

20. The electroluminescent display device according to claim 13, wherein the first N-type doping layer, the P-type doping layer, and the second N-type doping layer overlap each other.

* * * * *